United States Patent [19]
Hardin et al.

[11] Patent Number: 5,926,622
[45] Date of Patent: Jul. 20, 1999

[54] EFFICIENT REGRESSION VERIFICATION

[75] Inventors: Ronald H. Hardin, Pataskala, Ohio; Robert Paul Kurshan, New York, N.Y.

[73] Assignee: Lucent Technologies Inc., Murray Hill, N.J.

[21] Appl. No.: 08/820,221

[22] Filed: Mar. 18, 1997

[51] Int. Cl.⁶ .................................................. G06F 11/00
[52] U.S. Cl. .............................. 395/183.09; 395/183.13
[58] Field of Search ....................... 395/183.08, 183.09, 395/183.13, 183.14, 185.16, 183.01, 183.04, 183.07, 500; 371/27.1, 27.4; 364/488, 489, 491, 490

[56] References Cited

U.S. PATENT DOCUMENTS

| | | | |
|---|---|---|---|
| 5,418,941 | 5/1995 | Peters .................................. | 395/183.14 |
| 5,522,036 | 5/1996 | Shapiro .............................. | 395/183.14 |
| 5,615,333 | 3/1997 | Juettner et al. ..................... | 395/183.14 |
| 5,657,438 | 8/1997 | Wygodny et al. .................. | 395/183.14 |
| 5,673,387 | 9/1997 | Chen et al. ......................... | 395/183.14 |
| 5,694,540 | 12/1997 | Humelstine et al. .............. | 395/183.09 |
| 5,724,504 | 3/1998 | Aharon et al. ..................... | 395/183.09 |
| 5,729,554 | 3/1998 | Weir et al. .......................... | 395/183.07 |

OTHER PUBLICATIONS

White et al., "Test Manager: A Regression Testing Tool", Software Maintenance Conf., IEEE, pp. 338–347, 1993.

*Primary Examiner*—Joseph E. Palys
*Attorney, Agent, or Firm*—James DiGiorgio

[57] ABSTRACT

A method and apparatus for verifying the behavior of properties or functions of a system by forming a reduced model for each property of the system, and running a given simulation operation on the reduced model to verify the behavior of each said property. When a property or function does not behave as expected, the system model is adjusted, and only those functions having a property affected by the adjustment are rechecked. In one illustrative embodiment, a system model is reduced by eliminating all variables having no effect on the function or property being checked. The resulting reduced model can be further reduced by adjusting the range of each variable therein to a minimum range necessary to check the behavior of that specific property. If it becomes necessary to change the system model in order to fix a problem relative to one property, then only those properties having a reduced model affected by that change or fix are re-verified.

12 Claims, 2 Drawing Sheets

EFFICIENT REGRESSION VERIFICATION

FIELD OF THE INVENTION

The present invention relates to system verification, and more particularly to a method for reducing the number of simulation operations necessary to verify the behavior of a system having a plurality of properties or functions.

BACKGROUND OF THE INVENTION

An ongoing problem in the design of large systems is verifying that the system will indeed behave in the manner as intended by its designers. One approach has been to simply try out the system, either by building and testing the system itself or by building and testing a model of the system. In recent years, those skilled in the art have gravitated toward the approach of building and testing a model of the system through software. That is, the approach has been to form a computer simulation of the system, i.e. a computer program which is a model of the system, and executing the computer program to test the functionality or properties of the system.

In testing a design (i.e. hardware and/or software) in the course of development, those skilled in the art have classically created a model of the hardware or software, and run the model through a number of scenarios, wherein each scenario focuses on a functional aspect of the hardware or software design. Since a single scenario is rarely sufficient to test a given function of a design, a number of related scenarios are tested for each aspect or function of the design to determine whether the function is correctly implemented in the hardware or software. Together, the group of related scenarios is called a test suite. Thus, each function of a design is tested through a test suite which consists of several scenarios.

Running a single test suite can be an involved process, requiring set-up, running the scenarios, and evaluating the results. Although a test suite having a single scenario can be performed quickly, a test suite having many scenarios can be very time consuming and thus costly to run. Since many hardware and software designs require a test suite that contains many scenarios designed to check a very large number of possible variations of a "basic" scenario, present-day verification tools can be quite time-consuming, and thus costly for use in checking the behavior of a design.

To illustrate, many commercial hardware and software designs have roughly N independent functions wherein $10 \leq N \leq 100$. For each function N, a test suite is designed to check a given implementation (i.e. a system model). Assuming that the tests are run consecutively, then at some point during testing the given implementation may fail. That is, in testing a given implementation of a system design, the i-th test may find a system error or design problem. At that point, the source of the problem is located and the implementation is changed so as to fix the problem. Once the implementation is changed, however, the issue then becomes whether the fix or change of the implementation necessitates the re-testing of all previously tested test suites. That is, does an adjustment to fix one problem during the i-th test adversely affect the implementation with respect to another function or property of the design. If the fix or adjustment causes a break in the functionality of any of the previous (i−1) tests, then the function of that previously tested property must be re-checked.

One common method of determining whether an adjustment to the implementation resulting from testing one scenario has affected the function of a previously tested aspect of the system design is called regression testing. In regression testing, when the i-th test causes a change to the given implementation being tested, the previous (i−1) tests are re-run to insure that the previously-checked property still behaves as expected. Although fixing one problem does not always cause a problem or break with another property or function of the design, almost no system implementation behaves as expected the first time around. As a result, it can be argued that one can expect on the order of $N^2$ regression tests for an N-function or N-property design. Thus, for a design having N=50 functions, regression testing can be very time consuming and quite time consuming and costly.

Another method for testing a hardware and/or software design is formal verification. In formal verification, the designer provides a logical definition of the intended behavior of the design or system, and a logical design of the implementation of the design, to a formal verification system. The formal verification system then determines whether the logical definition of the system's intended behavior implies the logical definition of the implementation. That is, the formal verification system determines whether the implementation can perform the functions or tasks it is intended to perform, as defined by the system specification.

When the formal verification system finds a function or task which the implementation can not perform, the logical definition of the implementation must be adjusted. And, when such an adjustment is made, the system is faced with the same methodological problem associated with testing, as described above. That is, the verification system must re-verify all previously verified tasks to insure that the adjustment did not affect the behavior of the implementation for those tasks or functions.

For example, for regression verification (the analog of regression testing, when verification is used in place of testing), re-verifying the behavior of a property or function of the system, after a change is made, can be extremely or even prohibitively costly. This is due to the fact that a single verification run may take many hours or even days. To illustrate, for N=50, even if each verification run takes only one hour, regression verification could take in excess of 100 cpu days. As one can imagine, such a demand on computer resources may lie outside the limit of feasibility for many projects. Accordingly, there is a need to reduce the time and cost associated with such verification systems when testing an implementation of a design.

SUMMARY OF THE INVENTION

We have realized an efficient technique for developing a system in the context of testing or verification, which limits the number of required regression tests by forming a reduced model for each property or function of the system, and running a given verification operation on the reduced model to verify the behavior of each property. In addition, when a property or function does not behave as expected, the system model is adjusted, and only those functions having a property affected by the adjustment are rechecked.

In an illustrative embodiment of the invention, the system model is reduced by eliminating all variables having no effect on the function or property being checked. That is, for a given property of a system, only those variables and those input-output relationships between the variables upon which the given property has a dependence are included in the reduced model for checking the behavior of that given property. The resulting model can be further reduced by adjusting the range of each variable therein to a minimum range necessary to check the behavior of that specific property. That is, the function of the reduced model is checked by performing simulation operations, wherein each variable is tested only in a range that could possibly affect the specific property of the system being checked. Such a reduction of the range of each variable in the test model is called localization reduction. Thus, according to the principles of the present invention, if it becomes necessary to change the system model in order to fix a problem relative to one property, then only those properties having a reduced model affected by that change or fix will be re-checked. The remaining properties, being unaffected by the change, need not be re-checked. As a result, the present invention eliminates the need, for each change in the system model, to re-check the behavior of all prior-tested properties. Thus, the present invention overcomes, to a large extent, the limitations of the prior art.

DETAILED DESCRIPTION OF ILLUSTRATIVE EMBODIMENTS OF THE INVENTION

Figure 1:
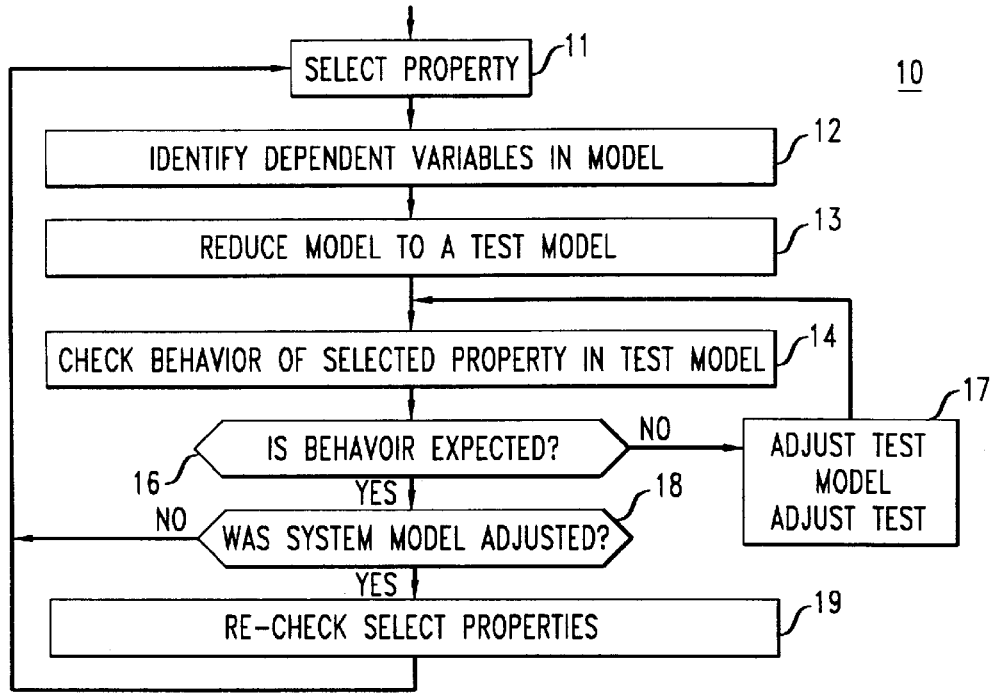
FIG. 1 is flow chart block diagram of an illustrative embodiment of a method for reducing simulation operations according to the present invention.

Referring now to FIG. 1 there is shown a block diagram of an illustrative embodiment of a method for verifying a system model according to the present invention, hereinafter referred to as method 10. As shown, method 10 begins at step 11 with the selection of a property or function of a system model which is designed to perform a plurality of functions or properties according to a system specification. Once the property is selected, the system model is searched at step 21 to identify all variables having an effect on the model behavior when performing the selected function or property. Once these significant variables are identified, the system model is reduced, at step 13, to a test model which includes only those significant variables and the input-output relationships, associated with the significant variables, that affect the selected function. Then, at step 14, simulation operations are run on the test model to check the behavior of the test model when performing the selected function.

If, at step 16, the test model behavior was not the expected behavior, according to the selected function, then the test model and the system model are adjusted, at step 17, until the behavior of the test model is the expected behavior when performing the selected function. If the test model behaved as expected, then, at step 18, it is determined whether the system model was adjusted (i.e. whether a significant variable or an associated input-output relationship was changed). If the system model was not adjusted, a new property is selected for verification at step 11, and the process repeats all the inclusive steps described above. If, however, the system model was adjusted, then at step 19, the behavior of all previously-checked properties, or select properties, must be re-checked before returning to step 11, whereby another property of the system is selected for checking as described above. According to the present invention, the select properties (i.e. previously checked properties) include only those properties having variables and/or input-output relationships affected by the adjustment to the system model.

Figure 2:
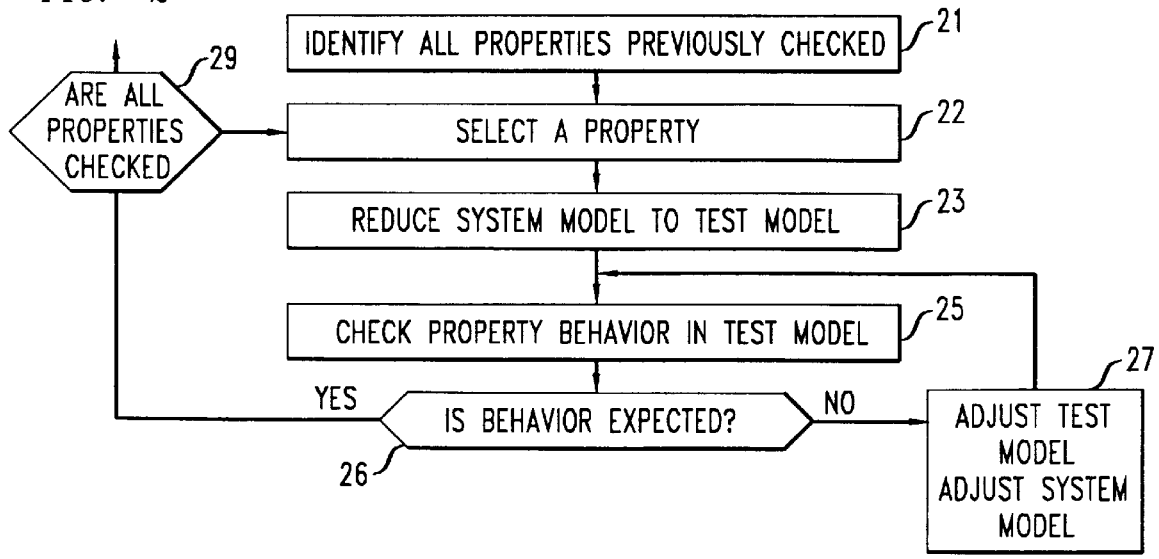
FIG. 2 is a flow chart block diagram showing one illustrative embodiment of a method for re-checking the system properties, after a change is made to the system implementation, according to the present invention.

An illustrative method of re-checking the select, previously-checked properties, when an adjustment is made to the system, is shown in FIG. 2. As shown, at step 21, the select, previously-checked properties are identified. Then, at step 22, a property is chosen from the identified select properties. Then, at step 23, the system model is reduced to form a new test model which includes only the significant variables and input-output relationships that affect the behavior of the chosen select property. Then, at step 25, the new test model behavior is tested when performing the chosen select property. If, at step 26, the test model behavior is the behavior expected when performing the chosen select property, then the new test model and the system model are adjusted at step 27, until the new test model behavior is the expected behavior. If at step 26, however, the re-checked behavior is the expected behavior, then it is determined, at step 29, whether all the previously-checked properties have been re-checked. If all such properties have been re-checked, then a new property can be selected for checking according to the steps of method 10, shown in FIG. 1. Otherwise, another property is selected, at step 22, for re-checking.

Figure 3:
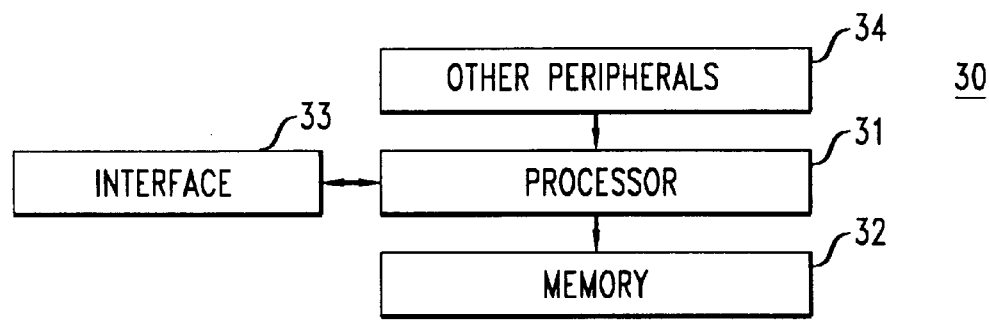
FIG. 3 is a block diagram of one illustrative embodiment of an apparatus for reducing simulation operations according to the present invention.

The steps described above and shown in FIG.'s 1 and 2 can be performed in any manner and/or by any means desired by thosed skilled in the art. It is therefore understood that an illustrative embodiment of an apparatus for verifying a system model, according to the present invention, can have any composition capable of performing the such steps. An illustrative embodiment of such an apparatus is shown in FIG. 3, hereinafter referred to as apparatus 30. As shown, apparatus 30 has processor 31 electrically connected to a memory 32, an interface terminal 33 and other peripherals 34.

In operation, a user, not shown, can enter a program defining a system model into memory 32 through interface terminal 33 and/or other peripherals 34. Once loaded, processor 31 provides a means for identifying, in a system model, a test set of variables which interact through a corresponding test set of input-output relationships to affect the behavior of a selected property of the system model, and reduces the system model to form a test model which only includes the test set of variables and the corresponding test set of input-output relationships that affect the behavior of the test property. From this test model, processor 31 is further operable to perform operations on the test model to check the behavior of the test property.

Figure 4:
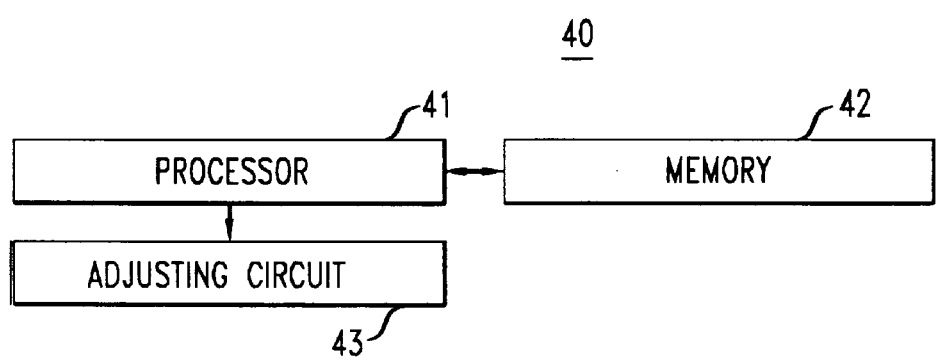
FIG. 4 is a block diagram of one illustrative embodiment of a system for reducing simulation operations according to the present invention.

Referring now to FIG. 4, there is shown an illustrative embodiment of a system for performing the method of reducing simulation operations according to the present invention, hereinafter referred to as system 40. As shown, system 40 has a processor 41 connected to a memory 42 and an adjusting circuit 43. In operation, processor 41 selects the property to be checked, identifies the set of variables in the model that affect the behavior of the selected property, reduces the system model to form a test model for the selected property wherein the test model includes the identified set of variables, and performs simulation operations on the test model to check the behavior of the property.

If the behavior of the property is not an expected behavior, then processor 41 adjusts the test model through adjusting circuit 43, and re-checks the behavior of the property until the checked behavior is the expected behavior. In the event that the system model is adjusted during the checking of any property, processor 41 re-checks only those previously checked properties having a test model with a variable affected by the adjustment to the system model, and stores, in memory 42, information based on said adjustments to the system model.

While the invention has been particularly shown and described with reference to various embodiments, it will be recognized by those skilled in the art that modifications and changes may be made to the present invention without departing from the spirit and scope thereof. For example, a test model can be further reduced through a process called localization reduction wherein the range of a set of variables in the test model are reduced to a minimum range necessary to check the behavior of the specific property for which the test model is designed. Thus, providing a means for a method according to the present invention to further reduce the simulation operations required to test a system model. As a result, the invention in its broader aspects is not limited to specific details shown and described herein. Accordingly, various modifications may be made without departing from the spirit or scope of the general inventive concept as defined by the appended claims and their equivalents.

We claim:

1. A method for verifying a system model which is designed to provide a set of properties, the system model having a set of variables which interact through input-output relationships to affect the behavior of the system model when performing the set of properties, the method comprising the steps of:

a. selecting, for behavior verification, a test property from the set of properties;

b. identifying, in the model, a test set of variables and a corresponding test set of input-output relationships that affect the behavior of said test property;

c. reducing the model to form a test model comprising said test set of variables and said corresponding test set of the input-output relationships that affect the behavior of said test property; and d. performing operations on said test model to check the behavior of said test property.

2. The method of claim 1 further comprising the step of repeating steps a through d for each property of the system.

3. The method of claim 2 wherein each variable has a given range and wherein said step of reducing the model in step c includes the step of reducing the range of said test set of variables to a minimum range necessary to check the behavior of said test property.

4. The method of claim 1 further comprising the steps of: adjusting said test model until said behavior of said test property is an expected behavior; and
adjusting the system model to reflect said adjustments to the test model.

5. The method of claim 1 further comprising the steps of: identifying, when said test model is adjusted, any previously-checked property having a variable and/or an input-output relationship affected by said adjustment, to form a set of select properties; and
repeating steps a through d for said set of select properties.

6. The method of claim 5 further comprising the steps of: adjusting the test model, until the behavior of the test model is an expected behavior when performing a select property from said set of select properties; and
adjusting the system model to reflect said adjustments to the test model.

7. An apparatus for verifying a system model designed to provide a set of properties, the system model having a set of variables which interact through input-output relationships to affect the behavior of the system model when performing the set of properties, the apparatus comprising:

means for identifying, in the system model, a test set of variables which interact through a corresponding test set of input-output relationships to affect the behavior of a selected one of said properties; and means for reducing the system model to form a test model comprising said test set of variables and said corresponding test set of the input-output relationships that affect the behavior of said selected one of said properties, and for performing operations on said test model to check the behavior of said test property.

8. The apparatus of claim 7 wherein each variable has a given range of values, and wherein the apparatus further comprises means for reducing the range of a set of variables of said test model to a minimum range necessary to check the behavior of said test property.

9. The apparatus of claim 7 further comprising:

means for adjusting said test model until the behavior of said test property is an expected behavior; and means for adjusting the system model to reflect said adjustments to the test model.

10. The apparatus of claim 7 further comprising:

means for identifying, when said test model is adjusted, any previously-checked property having a variable and/or an input-output relationship affected by said adjustment, to form a set of select properties; and means for repeating, for each select property, said means for selecting a test property from the set of select properties, said means for identifying, said means for reducing the system model to form a new test model, and said means for performing operations on said new test model.

11. The apparatus of claim 10 further comprising:

means for adjusting the new test model, until the behavior of the new test model is an expected behavior when performing a select property from said set of select properties; and means for adjusting the system model to reflect said adjustments to the new test model.

12. A system for verifying a model designed to provide a set of properties, the model having a set of variables which interact through input-output relationships to effect the behavior of the set of properties, each variable having a given range, the system comprising a processor operable to select a test property from the given set of properties of the model for behavior verification, identify, in the model, a test set of variables which interact through a corresponding test set of input-output relationships to effect the behavior of said test property, reduce the model to form a test model comprising said test set of variables and said corresponding test set of input-output relationships, and perform operations on said test model to check the behavior of said test property; a circuit for adjusting said test models and said model when an error is found; and a memory for storing information based on said adjustments.

* * * * *